United States Patent
Inukai

(10) Patent No.: US 7,365,715 B2
(45) Date of Patent: Apr. 29, 2008

(54) ELECTRONIC CIRCUIT, ELECTRONIC DEVICE AND PERSONAL COMPUTER

(75) Inventor: Kazutaka Inukai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 444 days.

(21) Appl. No.: 10/743,344

(22) Filed: Dec. 23, 2003

(65) Prior Publication Data

US 2004/0239379 A1 Dec. 2, 2004

(30) Foreign Application Priority Data

Dec. 27, 2002 (JP) ............... 2002-382636

(51) Int. Cl.
G09G 3/30 (2006.01)

(52) U.S. Cl. .................. 345/76; 345/82; 345/204

(58) Field of Classification Search ............ 345/87–90, 345/92, 76, 82, 211, 84, 204; 315/169.1, 315/169.3; 327/50–57, 108
See application file for complete search history.

(56) References Cited

U.S. PATENT DOCUMENTS

| | | | | |
|---|---|---|---|---|
| 3,766,543 A * | 10/1973 | Te Winkel et al. | ......... | 341/118 |
| 4,847,567 A * | 7/1989 | Fenk | ............... | 330/254 |
| 5,734,237 A * | 3/1998 | Engel | | |
| 5,748,165 A | 5/1998 | Kubota et al. | | |
| 6,091,203 A | 7/2000 | Kawashima et al. | | |
| 6,229,506 B1 | 5/2001 | Dawson et al. | | |
| 6,344,843 B1 | 2/2002 | Koyama et al. | | |
| 6,501,466 B1 | 12/2002 | Yamagishi et al. | | |
| 6,586,888 B2 * | 7/2003 | Kitahara et al. | ......... | 315/169.1 |
| 6,611,107 B2 | 8/2003 | Mikami et al. | | |
| 6,777,913 B2 * | 8/2004 | You | | |
| 6,798,148 B2 * | 9/2004 | Inukai | ............. | 345/76 |
| 6,909,242 B2 | 6/2005 | Kimura | | |
| 2002/0047817 A1 | 4/2002 | Tam | | |
| 2003/0128200 A1 | 7/2003 | Yumoto | | |
| 2003/0142046 A1 | 7/2003 | Kasai et al. | | |
| 2003/0164685 A1 | 9/2003 | Inukai | | |
| 2004/0041752 A1 | 3/2004 | Kimura | | |

FOREIGN PATENT DOCUMENTS

EP  1102234  5/2001

(Continued)

OTHER PUBLICATIONS

International Search Report (Application No. PCT/JP03/16357), Mar. 30, 2004, partial translation, 4 pages.

(Continued)

Primary Examiner—Regina Liang
(74) Attorney, Agent, or Firm—Fish & Richardson P.C.

(57) ABSTRACT

The invention provides a current data amplifier circuit of which output current value is accurate even when transistors with large variation in electrical characteristics are used. According to the invention, a plurality of transistors configuring a driving element is used in a series connection state when inputting current and in a parallel connection state when outputting current. Thus, is it significantly suppressed that the variation are not reflected on the output current value even when the plurality of transistors configuring the driving element have variation.

37 Claims, 5 Drawing Sheets

FOREIGN PATENT DOCUMENTS

| | | |
|---|---|---|
| EP | 1103946 | 5/2001 |
| EP | 1282103 | 2/2003 |
| EP | 1 333 422 A1 | 8/2003 |
| JP | 08-137443 | 5/1996 |
| JP | 11-282419 | 10/1999 |
| JP | 2001-147659 | 5/2001 |
| JP | 2001-343933 | 12/2001 |
| JP | 2002-514320 | 5/2002 |
| JP | 2003-255896 | 9/2003 |
| WO | WO 98/48403 | 10/1998 |

OTHER PUBLICATIONS

International Preliminary Examination Report (Application No. PCT/JP03/16357), May 11, 2004, partial translation, 5 pages.

I.M. Hunter et al.; "Active Matrix Addressing of Polymer Light Emitting Diodes Using Low Temperature Poly Silicon TFTs"; *AM-LCD 2000*; pp. 249-252, 2000.

Yumoto, A et al., "Pixel-Driving Methods for Large-Sized Poly-Si-AM-OLED-Displays," Asia Display/IDW '01, 2001, pp. 1395-1398.

Hunter, I. et al., "Performance of p-Si-Pixel Circuits for Active Matrix Polymer LED Displays," AM-LCD '01, Digest of Technical Papers, 2001, pp. 215-218.

Kurita, T., "Requirements for LCD to Gain High Moving Image Quality—Improvement of Quality Degraded by Hold-Type Display," AM-LCD '00 Digest of Technical Papers, 2000, pp. 1-4.

Examination Report (Application No. 200300771-3, SG6268/6585, dated Feb. 25, 2005.

* cited by examiner

[FIG. 3]
PRIOR ART
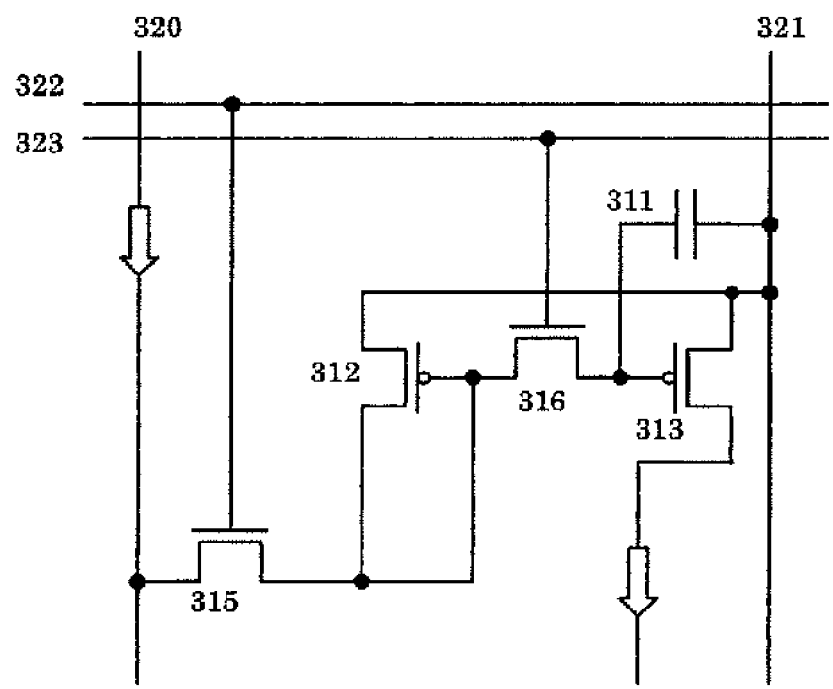

ELECTRONIC CIRCUIT, ELECTRONIC DEVICE AND PERSONAL COMPUTER

TECHNICAL FIELD

The present invention relates to an electronic circuit, and more particularly such an electronic circuit that amplifies current data. Also the invention relates to an integrated circuit (IC) or a system circuit using the electronic circuit in one portion thereof, and more particularly such an electronic device having the IC or the system circuit.

DESCRIPTION OF THE RELATED ART

In an electronic device which has been advanced in high performance, compactness (downsizing) and low power consumption, an IC (integrated circuit) used internally is required to be high in performance, small in size and high in integration and such demands are further growing. A MOS-FET (Field Effect Transistor) IC using a conventional general bulk silicon (silicon wafer) has been progressed in performance, downsizing and integration steadily up to now and this tendency is likely to continue.

Moreover, an IC that is expected to be improved in performance, downsized and integrated includes an IC using a thin film transistor (TFT).

An active matrix type (AM type) liquid crystal display (LCD) using a polycrystalline silicon (polysilicon) TFT which has recently become used in a small display device field has a great advantage in not only that a video signal can be stored in a pixel portion but also that a driver circuit and the like can be integrated on a panel. That is, a module is large and complicated in a conventional PM type (passive matrix type) and an AM type using amorphous silicon TFIs because ICs separately fabricated into chips had to be used as a driver circuit and the like. In an AM type using a polysilicon TFT in which a driver circuit and the like are integrated on a panel, however, a module is greatly miniaturized.

Integration of a driver circuit and the like on a panel also plays a great role in improving the precision of a display of display device. In the case where a driver circuit is not integrated on the panel, the finest possible pixel pitch of the display of display device is dependent on the interval between a connecting terminal on the panel and an external IC. By integrating a driver circuit on the panel, this dependency no longer exists.

At present, only rather simple circuit represented by a driver circuit can be integrated on the panel in AM type LCD using a polysilicon TFT. However, it is an inevitable subject to improve the circuit integrated on the panel in performance, downsizing and integration in order to realize a more advanced, complicated and multifunctional panel.

There are various kinds of circuits to be newly integrated on the panel, including a circuit that amplifies current data.

Just like the AM type LCD, an AM type OLED (Organic Light Emitting Diode) display device is also required to have a high performance, compactness and high integration of a circuit integrated on the panel. For the present, only a PM type OLED display device is put into practical use, but an AM type OLED display device using a polysilicon TFT is also now being developed rapidly aiming at practical use. Further, as the OLED is a current drive while the liquid crystal is a voltage drive, a method in which a video signal is processed as current data is becoming a mainstream in the OLED display device. In that case, a current data amplifier circuit is highly required when processing video signals.

The most common circuit that amplifies current data is a current mirror circuit. FIG. 3 shows an example of the current mirror circuit.

DISCLOSURE OF THE INVENTION

Problem to be Solved by the Invention

Hereinafter explained is the case where an input current is amplified by using a current mirror circuit. The explanation here is made on the case where the input current is amplified twice as large. It is assumed hereafter that a transistor is a desirable MOSFET, and for the channel size, length is denoted as L, width is denoted as W, and an insulating film thickness is denoted as d.

It is assumed that transistors 312 and 313 are equal in d, and the ratio of W/L of the transistor 312 to the transistor 313 is 1:2.

When inputting current data, transistors 315 and 316 are both turned ON and a current flows between 320 and 321. When the current value becomes steady, the transistors 316 and 315 are turned OFF. By operating the transistor 313 in a saturation region, an output current value becomes twice as large as an input current value.

When electrical characteristics (such as threshold voltage value, field-effect mobility) of the transistors 312 and 313 are uniform, the output current value becomes exactly twice as large as the input current value. That is, current data is amplified accurately. However, when the electrical characteristics of the transistors 312 and 313 vary, amplification becomes inaccurate depending on the variation.

The polysilicon TFT generally varies easily in electrical characteristics due to defects and the like in a crystal grain boundary. In the circuit of FIG. 3, by arranging the transistors 312 and 313 adjacently, variation in electrical characteristics can be alleviated though slightly. In the case where the accuracy of the current value is required, however, the current mirror circuit as shown in FIG. 3 is not appropriate to be used as a current data amplifier circuit.

In view of the foregoing problems, the invention provides a current data amplifier circuit of which output current value is accurate even when transistors with large variation in electrical characteristics such as polysilicon TFTs are used.

A current data amplifier circuit of the invention is an electronic circuit including a driving element having a plurality of transistors, a method to switch between a series connection state and a parallel connection state of the plurality of transistors, wherein an inputted current is amplified for output. The current data amplifier circuit of the invention is an electronic circuit including a driving element having a plurality of transistors, wherein the plurality of transistors become series connection state when inputting a current and parallel connection state when outputting the current.

A current data amplifier circuit of the invention is an electronic circuit which amplifies the inputted current for output including a driving element having a plurality of transistors, a switch, wherein the gates of plurality of transistors are connected to each other, at least one of a source or a drain of each of the plurality of transistors is connected to a source or a drain of another transistor of the plurality of transistors, and the plurality of transistors become series connection state and parallel connection state by changing over the switch.

A current data amplifier circuit of the invention is an electronic circuit including n transistors, first and second switches, wherein gates of n transistors are electrically connected to each other, either of sources or drains of the n transistors are electrically connected to the first switch respectively, another of sources or drains of the n transistors are electrically connected to the second switch respectively, when a current is inputted to the electronic circuit, as for a kth transistor of the n transistors (k=2 to less than n), the current flows from a (k−1)th transistor to a (k+1)th transistor via the kth transistor, and when the current is outputted from the electronic circuit, as for the kth transistor, the current flows from the side connected to the second switch to the side connected to the first switch.

The current data amplifier circuit of the invention can be fabricated on an insulating substrate by using a TFT of such as a polysilicon film. Needless to say, a bulk silicon (wafer) transistor can be employed as well. The current data amplifier circuit of the invention can be applied to an IC of such system circuit and the like of an electrical device as a signal processing circuit, a control circuit, an interface circuit and the like. The current data amplifier circuit of the invention can also be applied to a driver circuit of a display device.

As for the plurality of transistors provided in a driving element of the current data amplifier circuit of the invention, structural parameters (channel length L, channel width W, and insulating film thickness d and the like) and channel types thereof are not necessarily but preferably the same unless otherwise specially needed. In the following examples, the parameters and channel types are the same.

EFFECT OF THE INVENTION

In the current data amplifier circuit of the invention, a driving element is configured by a plurality of transistors. When reading in data current, the plurality of transistors becomes the series connection state and when outputting the current, the plurality of transistors becomes the parallel connection state. Thus, series or parallel states of the plurality of transistors configuring the driving element are appropriately switched over. As a result, the following effect occurs.

First of all, as long as a variation does not exist among the plurality of transistors configuring the driving element in the identical current data amplifier circuit, a critical defect that an output current $I_{out}$ varies can be avoided. That is, electrical characteristics of transistors arranged in different current data amplifier circuits sometimes vary greatly when observed as a whole substrate even if they are the same in size. However, it is possible to avoid that this variation is reflected to the different current data amplifier circuits on the substrate as the output current $I_{out}$. Also in the case where a current mirror circuit as in FIG. 3 is employed, the output current $I_{out}$ as a whole substrate does not vary as long as transistors in the current mirror circuit in the identical current data amplifier circuit do not vary in electrical characteristics. In this respect, the invention has the same effect as the case of the current data amplifier circuit which employs the current mirror circuit as shown in FIG. 3.

In the case where the current mirror circuit as in FIG. 3 is employed, however, when a variation exists between transistors of the current mirror circuit in the identical current data amplifier circuit, it cannot prevent the output current $I_{out}$ from varying between the different current data amplifier circuits. On the other hand, according to the invention, even when a variation exists among the plurality of transistors configuring a driving element in the identical current data amplifier circuit, the effect can be suppressed so small that the output current does not vary between the current data amplifier circuits so much as to become a problem in practical use.

BRIEF DESCRIPTION OF THE DRAWINGS

FIG. 3 is a diagram showing an example of a current data amplifier circuit.

BEST EMBODIMENT MODE OF THE INVENTION

Embodiment Model

An outline of a current data amplifier circuit of the invention is now explained with reference to FIGS. 1 and 2.

First, FIG. 1 is explained. FIG. 1(A) shows an example of the current data amplifier circuit of the invention. FIG. 1(B) shows FIG. 1(A) of which driving element is illustrated by three transistors.

Figure 1A:
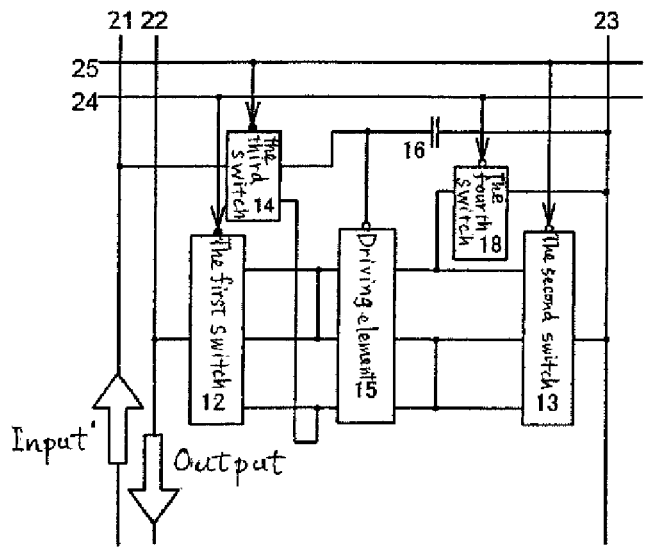
FIGS. 1A to 1E are diagrams showing examples of a current data amplifier circuit of the invention.
Figure 1B:
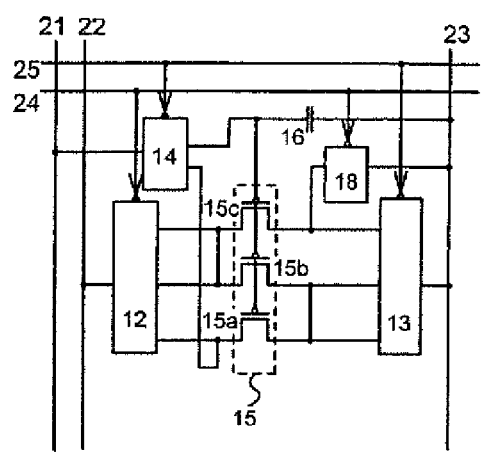

The current data amplifier circuit of FIGS. 1(A) and 1(B) include a first switch 12, a second switch 13, a third switch 14, and a fourth switch 18 besides a driving element 15. As for each of first to fourth switches in FIG. 1, a point of ○ (white circle) or ● (black circle) denotes a control portion of the switches, and each of other plurality of points becomes conductive or open simultaneously in accordance with the signal sent to the control portion. The control portion ○ (white circle) denotes low active (conductive when signal is low), and the control portion ● (black circle) denotes high active (conductive when signal is high). The first switch 12, the second switch 13, the third switch 14, and the fourth switch 18 correspond to methods to switch over a series connection state and a parallel connection state of the plurality of transistors provided in the driving element.

Figure 1C:
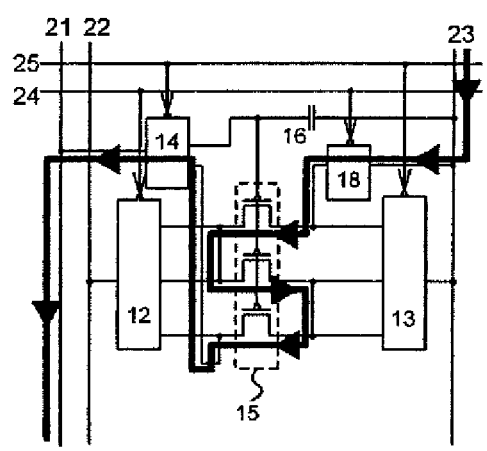
Figure 1D:
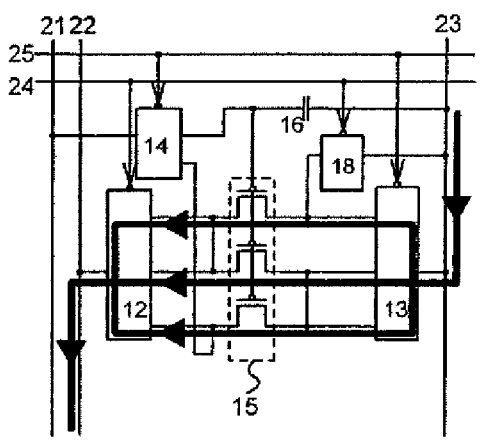
Figure 1E:
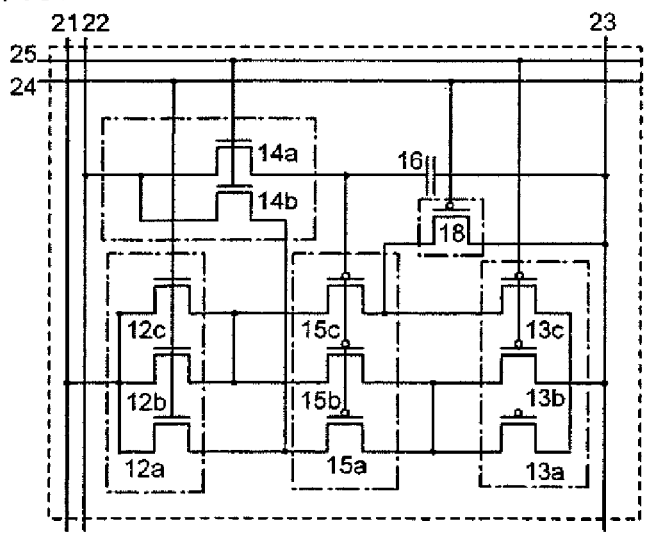

FIG. 1(E) shows an example of FIG. 1(A) in which not only a driving element but also each switch is illustrated by a transistor. Needless to say, each switch is capable of being illustrated by other transistor configuration than this and not limited to this configuration. Moreover, as for the first switch 12 and the second switch 13 and the like which change over 3 or more points conductive and open simultaneously, an arbitrary portion can be separated to be controlled independently from the other portions.

In FIGS. 1(A) and 1(B), reference numeral 21 denotes a current data input line, 22 denotes a current data output line, 23 denotes a high potential power supply line, 24 denotes a first control line, and 25 denotes a second control line.

The first switch 12, the second switch 13, the third switch 14, and the fourth switch 18 are controlled as follows when current data is inputted and outputted. When the current data is inputted, the first switch 12 and the second switch 13 are turned OFF (open), while the third switch 14 and the fourth switch 18 are turned ON (conductive). On the other hand, when the current data is outputted, the first switch 12 and the second switch 13 are turned ON (conductive), while the third switch 14 and the fourth switch 18 are turned OFF (open). Results of the foregoing operations are shown in FIGS. 1(C) and 1(D). FIG. 1(C) shows a current path in the case of inputting current data in a bold line, and FIG. 1(D) shows a current path in the case of outputting current data in a bold line. In FIG. 1(C), a current flows through three transistors of a driving element in a series state, while in FIG. 1(D) a current flows through three transistors of a driving element in a parallel state.

In the case where three transistors of the driving element in FIG. 1 are equal in electrical characteristics, the output current is nine times as large as the input current. Generally, in the case where the driving element is configured by n transistors which are equal in electrical characteristics, the output current becomes $n^2$ times as large as the input current.

It is to be noted that in the case where each of the three transistors of the driving element has some variation in electrical characteristics, a slight deviation from the output current of nine times as large as the input current occurs in accordance with the variation. Of course, this deviation is small as compared to the case where the current mirror circuit shown in FIG. 3 is employed. Therefore, the current data amplifier circuit of the invention is effective in the case where some variation in electrical characteristics of the transistors are inevitable.

As for the three transistors of the driving element in FIG. 1, it is desirable that each source and drain is in symmetry. This is because the direction of current flow is inverted in the transistor 15b between when inputting and outputting current data. It is needless to say that a current data amplifier circuit of the invention does not necessarily have to have a source and drain in symmetry, though.

Embodiment Mode 2

FIG. 2 is explained now. FIGS. 2(A) to 2(D) show other four examples of a current data amplifier circuit of the invention. It should be noted that a current data amplifier circuit of the invention can be configured in so many various ways that all of them cannot be shown, thus FIGS. 2(A) to 2(D) are only representative examples.

Each of first to fourth switches of FIG. 2 is the same as the ones in FIG. 1. ○ (white circle) or ● (black circle) is a control portion of the switches, and each of other plurality of points becomes conductive or open simultaneously in accordance with the signal sent to the control portion. The control portion ○ (white circle) denotes low active (conductive when signal is low), and the control portion ● (black circle) denotes high active (conductive when signal is high). Each of the switches in FIG. 2 can be illustrated by using transistors as is in FIG. 1(E), however, it is omitted here for simplicity.

Figure 2A:
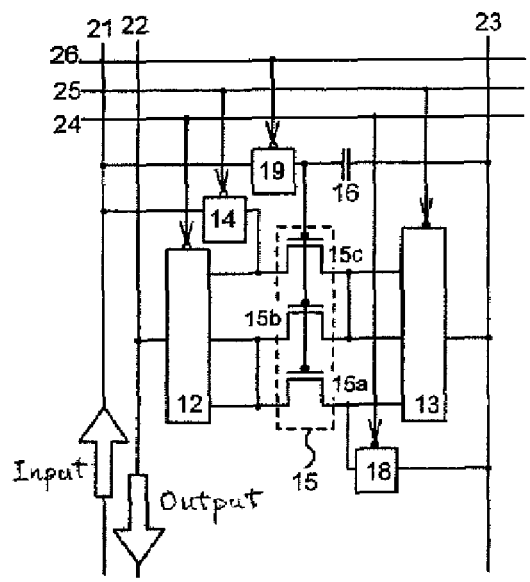
FIGS. 2A to 2D are diagrams showing examples of a current data amplifier circuit of the invention.

FIG. 2(A) shows a configuration example in which a driving element is configured by n-channel type transistors and the direction of current is inverted from the one in FIG. 1. Also this configuration example is intended to reduce the influence of operation noise by separating a third switch into 14 and 19.

In FIG. 2(A), the driving element is configured by three transistors. A current data amplifier circuit of FIG. 2(A) includes a first switch 12, a second switch 13, a third switches 14 and 19, and a fourth switch 18 besides the driving element 15. The first switch 12, the second switch 13, the third switches 14 and 19, and the fourth switch 18 correspond to methods to switch over a series connection state and a parallel connection state of the plurality of transistors provided in the driving element.

In FIG. 2(A), reference numeral 21 denotes a current data input line, 22 denotes an output line, 23 denotes a low potential power supply line, 24 denotes a first control line, and 25 and 26 denote second control lines.

The first switch 12, the second switch 13, the third switches 14 and 19, and the fourth switch 18 are controlled as follows when current data is inputted and outputted. When the current data is inputted, the first switch 12 and the second switch 13 are turned OFF, while the third switches 14 and 19 and the fourth switch 18 are turned ON. On the other hand, when the current data is outputted, the third switches 14 and 19 and the fourth switch 18 are turned OFF while the first switch 12 and the second switch 13 are turned ON. As a result, current flows through three transistors 15a, 15b and 15c of the driving element in a series state when inputting current data, and current flows through the three transistors 15a, 15b and 15c of the driving element in a parallel state when outputting current data.

Further, when switching over the input of current data to the output, it is preferable that the third switch 19 is turned OFF before turning OFF the third switch 14 and the fourth switch 18. Thus, the influence of operation noise can be reduced.

In the case where three transistors of the driving element in FIG. 2(A) are equal in electrical characteristics, the output current is nine times as large as the input current. Generally, in the case where the driving element is configured by n transistors which are equal in electrical characteristics, the output current becomes $n^2$ times as large as the input current.

It is to be noted that in the case where each of the three transistors has some variation in electrical characteristics, a slight deviation from the output current of nine times as large as the input current occurs, in accordance with the variation. Of course, this deviation is small as compared to the case where the current mirror circuit shown in FIG. 3 is employed. Therefore, the current data amplifier circuit of the invention is effective in the case where some variation in electrical characteristics of the transistors are inevitable.

As for the three transistors of the driving element in FIG. 2(A), it is desirable that each source and drain is in symmetry. This is because the direction of current flow is inverted in the transistor 15b between when inputting and outputting current data. It is needless to say that a current data amplifier circuit of the invention does not necessarily have to have a source and drain in symmetry, though.

Figure 2B:
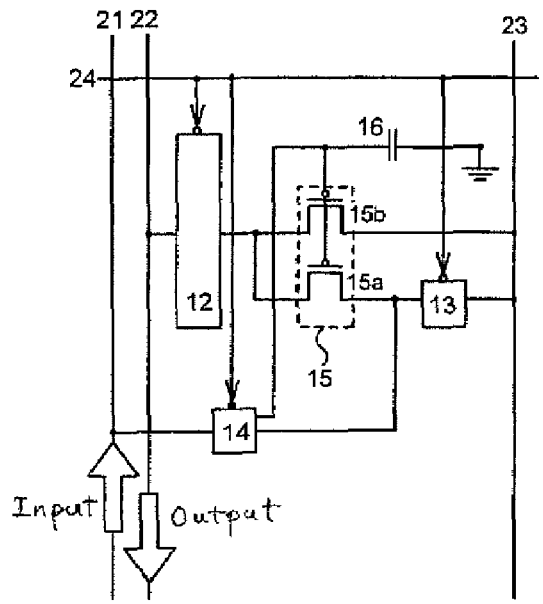

FIG. 2(B) is a configuration example in which a driving element is configured by two transistors. This configuration is also intended to reduce the arrangement area by miniaturizing the second switch 13 and merging control lines into one line. Moreover, a capacitor 16 is connected to GND.

A current data amplifier circuit in FIG. 2(B) includes a first switch 12, a second switch 13, and a third switch 14 besides a driving element 15. The first switch 12, the second switch 13, the third switch 14 correspond to methods to switch over a series connection state and a parallel connection state of the plurality of transistors provided in the driving element.

In FIG. 2(B), reference numeral 21 denotes a current data input line, 22 denotes an output line, 23 denotes a high potential power supply line, and 24 denotes a control line.

The first switch 12, the second switch 13, and the third switch 14 are controlled as follows when current data is inputted and outputted. When the current data is inputted, the first switch 12 and the second switch 13 are turned OFF (open), while the third switch 14 is turned ON (conductive). On the other hand, when the current data is outputted, the first switch 12 and the second switch 13 are turned ON (conductive), while the third switch 14 is turned OFF (open). As a result, current flows through two transistors 15a and 15b of the driving element in a series state when inputting current data, and current flows through the two transistors 15a and 15b of the driving element in a parallel state when outputting current data.

In FIG. 2(B), the capacitor 16 is provided between gate electrodes of two transistors of the driving element and GND. However, as the high potential power supply line 23 always have a constant potential, the capacitor 16 functions to store a voltage at the time of writing between gates and sources of the two transistors of the driving element. In that respect, there is no difference from examples of FIG. 1 and other three examples of FIG. 2.

In the case where the two transistors of the driving element in FIG. 2(B) are equal in electrical characteristics, the output current is four times as large as the input current. Generally, in the case where the driving element is configured by n transistors which are equal in electrical characteristics, the output current becomes $n^2$ times as large as the input current.

It is to be noted that in the case where each of the two transistors of the driving element has some variation in electrical characteristics, a slight deviation from the output current of four times as large as the input current occurs, in accordance with the variation. Of course, this deviation is small as compared to the case where the current mirror circuit shown in FIG. 3 is employed. Therefore, the current data amplifier circuit of the invention is effective in the case where some variation in electrical characteristics of the transistors are inevitable.

As for the two transistors of the driving element in FIG. 2(B), it is desirable that each source and drain is in symmetry. This is because the direction of current flow is inverted in the transistor 15a between when inputting and outputting current data. It is needless to say that a current data amplifier circuit of the invention does not necessarily have to have a source and drain in symmetry, though.

Figure 2C:
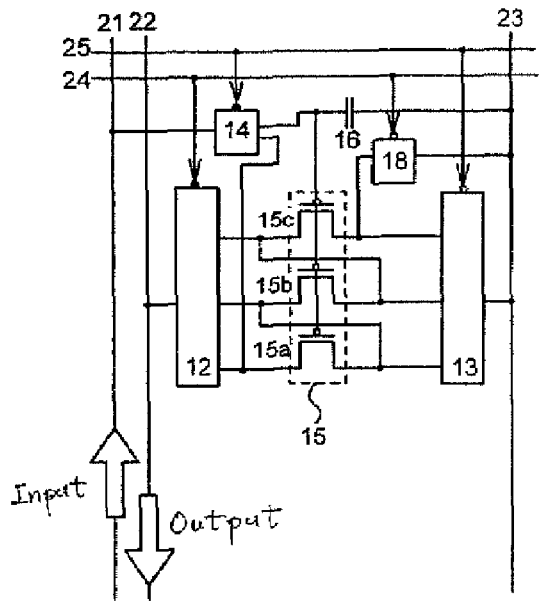

FIG. 2(C) shows a configuration example in which the transistors of the driving element are connected differently from the ones in FIG. 1.

In FIG. 2(C), a driving element is configured by three transistors. A current data amplifier circuit in FIG. 2(C) includes a first switch 12, a second switch 13, a third switch 14, and a fourth switch 18 besides the driving element 15. The first switch 12, the second switch 13, the third switch 14, and the fourth switch 18 correspond to methods to switch over a series connection state and a parallel connection state of the plurality of transistors provided in the driving element.

In FIG. 2(C), reference numeral 21 denotes a current data input line, 22 denotes an output line, 23 denotes a high potential power supply line, 24 denotes a first control line, and 25 denotes a second control line.

The first switch 12, the second switch 13, the third switch 14 and the fourth switch 18 are controlled as follows when current data is inputted and outputted. When the current data is inputted, the first switch 12 and the second switch 13 are turned OFF, while the third switch 14 and the fourth switch 18 are turned ON. On the other hand, when the current data is outputted, the first switch 12 and the second switch 13 are turned ON, while the third switch 14 and the fourth switch 18 are turned OFF. As a result, current flows through three transistors 15a, 15b and 15c of the driving element in a series state when inputting current data, and current flows through the three transistors 15a, 15b and 15c of the driving element in a parallel state when outputting current data.

In the case where three transistors of the driving element in FIG. 2(C) are equal in electrical characteristics, the output current is nine times as large as the input current. Generally, in the case where the driving element is configured by n transistors which are equal in electrical characteristics, the output current becomes $n^2$ times as large as the input current.

It is to be noted that in the case where each of the three transistors has some variation in electrical characteristics, a slight deviation from the output current of nine times as large as the input current occurs in accordance with the variation. Of course, this deviation is small as compared to the case where the current mirror circuit shown in FIG. 3 is employed. Therefore, the current data amplifier circuit of the invention is effective in the case where some variation in electrical characteristics of the transistors are inevitable.

Note that, as for the three transistors in FIG. 2(C), the direction of current flow is not inverted between when inputting and outputting current data. Thus, a current data amplification in higher performance can be expected in the circuit shown in FIG. 2(C) as compared to examples in FIG. 1.

Figure 2D:
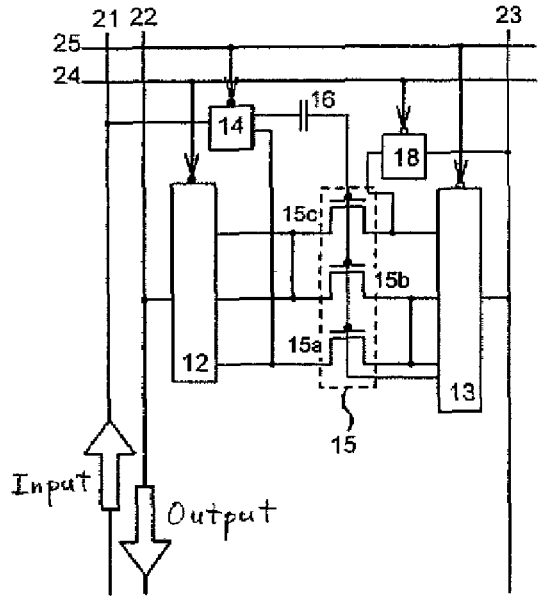

FIG. 2(D) shows a configuration example in which a driving element is configured by n-channel type transistors and the direction of current flow is the same as the one in FIG. 1.

In FIG. 2(D), the driving element is configured by three transistors. A current data amplifier circuit in FIG. 2(D) includes a first switch 12, a second switch 13, a third switch 14 and a fourth switch 18 besides the driving element 15. The first switch 12, the second switch 13, the third switch 14, and the fourth switch 18 correspond to methods to switch over a series connection state and a parallel connection state of the plurality of transistors provided in the driving element.

In FIG. 2(D), reference numeral 21 denotes a current data input line, 22 denotes an output line, 23 denotes a high potential power supply line, 24 denotes a first control line, and 25 and 26 denote second control lines.

The first switch 12, the second switch 13, the third switch 14, and the fourth switch 18 are controlled as follows when current data is inputted and outputted. When the current data is inputted, the first switch 12 and the second switch 13 are turned OFF, while the third switch 14 and the fourth switch 18 are turned ON. On the other hand, when the current data is outputted, the first switch 12 and the second switch 13 are turned ON while the third switch 14 and the fourth switch 18 are turned OFF. As a result, current flows through three transistors 15a, 15b and 15c of the driving element in a series state when inputting current data, and current flows through the three transistors 15a, 15b and 15c of the driving element in a parallel state when outputting current data.

In the case where three transistors of the driving element in FIG. 2(D) are equal in electrical characteristics, the output current is nine times as large as the input current. Generally, in the case where the driving element is configured by n transistors which are equal in electrical characteristics, the output current becomes $n^2$ times as large as the input current.

It is to be noted that in the case where each of the three transistors of the driving element has some variation in electrical characteristics, a slight deviation from the output current of nine times as large as the input current occurs, in accordance with the variation. Of course, this deviation is small as compared to the case where the current mirror circuit shown in FIG. 3 is employed. Therefore, the current data amplifier circuit of the invention is effective in the case where some variation in electrical characteristics of the transistors are inevitable.

As for the three transistors of the driving element in FIG. 2(D), it is desirable that each source and drain is in symmetry. This is because the direction of current flow is inverted in the transistor 15b between when inputting and outputting current data. Of course, a current data amplifier circuit of the invention does not necessarily have to have a source and drain in symmetry.

In FIGS. 2(A) to 2(D) as described above, a representative example of a current data amplifier circuit of the invention is shown by illustrating the cases where a driving element is configured by two or three transistors. However, it is needless to say that the driving element of the current data amplifier circuit of the invention may be configured by four or more transistors as well.

Furthermore, the control line may be provided in any numbers and any control line of any switch may be merged. In FIG. 2(C), for example, the first control line 24 controls the first switch 12 and the fourth switch 18, and the second control line 25 controls the second switch 13 and the third switch 14. However, the first control line 24 may controls the first switch 12 and the third switch 14, and the second control line 25 may control the second switch 13 and the fourth switch 18. Furthermore, a third control line and a fourth control line for controlling the third switch 14 and the fourth switch 18 respectively may be provided newly in order to control each switch independently. On the contrary, the first control line 24 may control the first switch 12 to fourth switch 18. (Adjustment is required as polarities of some switches are inverted accordingly, of course.)

Further, each element in FIG. 1 and FIGS. 2(A) to 2(D) may be used in various combinations. For example, in the case where the driving element is configured by two transistors as shown in FIG. 2(B), n-channel transistors may be employed as shown in FIG. 2(D). Or, while the transistors in the driving element are connected as in FIG. 2(C), a configuration in FIG. 2(A) may be employed in which the direction of current flow is inverted. The same applies to the combination of other elements. The same is also applied to the case where the driving element is configured by four or more transistors.

A current data amplifier circuit of the invention may be used with additional transistors or other elements and circuits.

Embodiment Mode 3

Figure 4A:
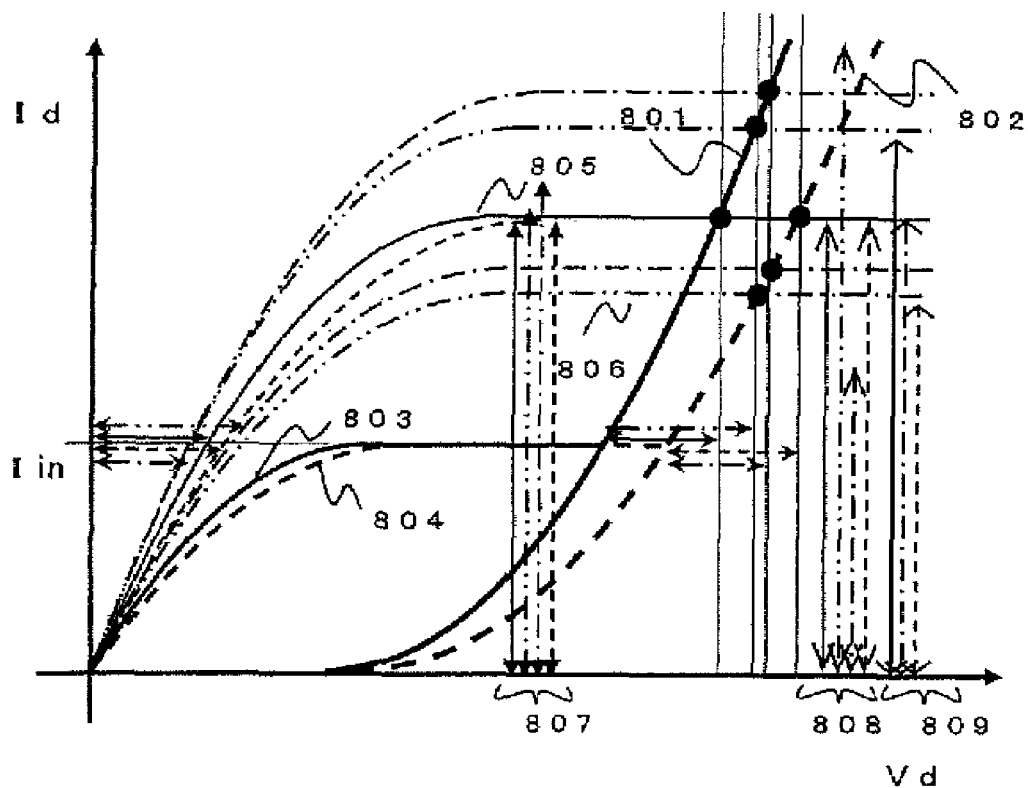
FIGS. 4A and 4B are diagrams showing the transistor characteristics configuring a driving transistor.
Figure 4B:
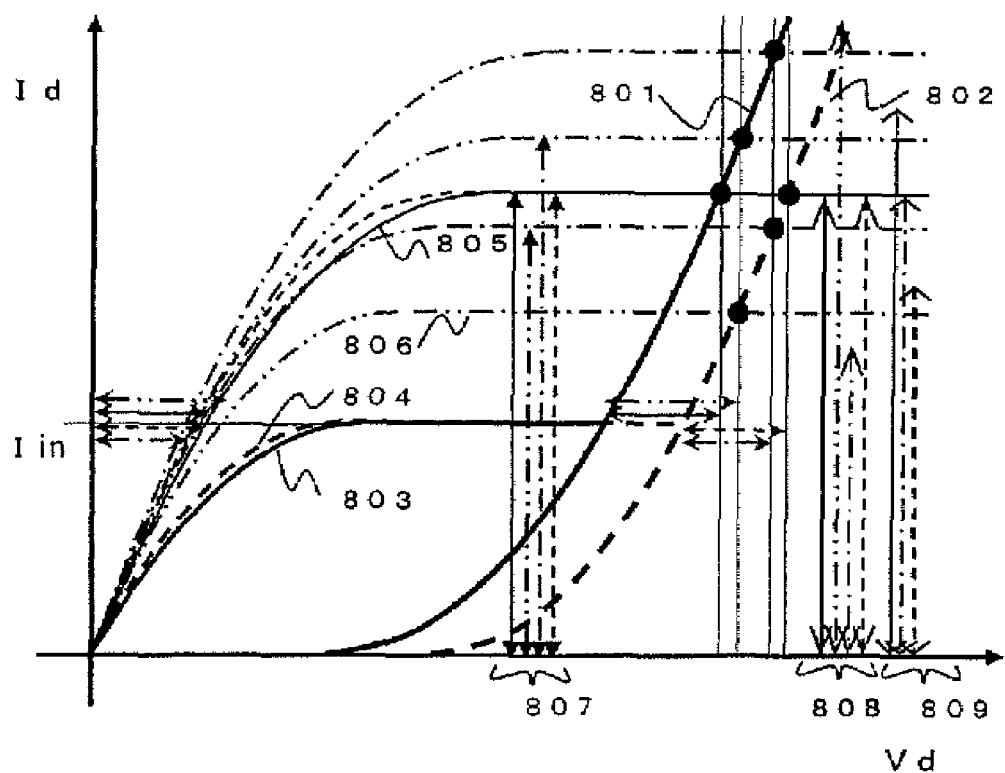

Hereinafter explained with reference to characteristic curves in FIG. 4 is an operation and effect of the current data amplifier circuit of the invention. In order to view the effect simply, FIG. 4(A) shows an example of a highly variable carrier mobility, and FIG. 4(B) shows an example of a highly variable threshold voltage.

To simplify the explanation, the case where two transistors configure a driving element is explained. It is to be noted that specific configuration of the current data amplifier circuit is identical to FIG. 2(B). Note that in FIG. 4 the positive and negative direction is set on the basis of n-channel type for convenience. (It should be noted that the positive and negative direction is switched in the case of p-channel type transistor.) Also characteristic curves shown in FIG. 4 are ideal ones for simplicity and there is a slight difference from an actual transistor. For example, a channel length modulation is zero in FIG. 4.

Based on a source potential of the transistor, a gate potential is given as $V_g$, a drain potential is given as $V_d$, and a current flowing between the source and drain is given as $I_d$. In FIGS. 4(A) and 4(B), curves 803 to 806 and the like are $I_d$-$V_d$ characteristic curves under a certain constant gate potential $V_g$. A bold solid line 801 shows the change in $I_d$-$V_d$ under the condition in which the $V_g$ and $V_d$ are equal by short-circuiting the gate and drain of one of the two transistors configuring the driving element. That is, the bold solid line 801 reflects the specific electrical characteristics (field effect mobility and a threshold voltage) of the transistors. Similarly, a bold dashed line 802 shows the change in $I_d$-$V_d$ under the condition in which the $V_g$ and $V_d$ are equal by short-circuiting the gate and drain of the other transistors configuring the driving element.

FIGS. 4(A) and 4(B) show how the output current changes by "switching over series and parallel" as the configuration of the invention in the case where each of the two transistors configuring the driving element has different electrical characteristics. FIG. 4(A) shows an example in which the difference in field effect mobility is particularly large between the two transistors. Therefore, difference in curvatures between the bold solid line 801 and the bold dashed line 802 is large. FIG. 4(B) shows an example in which the difference in threshold voltage is particularly large between the two transistors. Therefore, difference between the bold solid line 801 and the bold dashed line 802 is large at the starting point ($I_d$=0). In conclusion, the output current in each case corresponds to lengths of arrows with triangle arrowheads in 807. Brief explanation will be made on this below.

First, FIG. 4(A) is explained. At the beginning, the case where the bold solid line 801 corresponds to the characteristic curves of both the transistors 15a and 15b is explained.

When writing data current, the first switch 12 and the second switch 13 in FIG. 2(B) are turned OFF and the third switch 14 is turned ON. As the third switch 14 is turned ON, a gate and drain of the transistor 15a configuring the driving element are short-circuited. Therefore, an operation point of the transistor 15a is on the bold solid line 801, which is dependent on an input data current value $I_{in}$. Now it is assumed that the operation point is at the intersection point of the solid line 803 and the bold solid line 801.

On the other hand, the transistor 15b operates in non-saturation region when writing data current. A drain voltage $V_d$ of the transistor 15b is equivalent to what deducted a drain voltage $V_d$ of the transistor 15a from a gate voltage $V_g$ of the transistor 15b, therefore, lengths of two horizontal solid arrows are equal when an operation point of the transistor 15b is dependent on the current data value $I_{in}$ on the solid line 805.

When outputting current data, the first switch 12 and the second switch 13 in FIG. 2(B) are turned ON and the third switch 14 is turned OFF. As the third switch 14 is turned OFF, gate potentials of the transistors 15a and 15b are stored as they are of the time of data current writing. As a result, the gate voltage $V_g$ of the both transistors 15a and 15b becomes the sum of each drain voltage $V_d$ of the transistors 15a and 15b at the time of data current writing. The transistors 15a and 15b operate in saturation region when outputting current. Therefore, the operation points of both the transistors 15a and 15b are an intersection point of the solid line 805 and the bold solid line 801. That is, each of the transistors 15a and 15b flow as much current as the length of a solid arrow with a triangle arrowhead in 807. Furthermore, as the transistors 15a and 15b are connected in parallel, the output current $I_{out}$ is twice as large as the length of the solid arrow with a triangle arrowhead in 807.

Subsequently, in the case of FIG. 4(A), the case where the bold solid line 801 corresponds to a characteristic curve of the transistor 15a and the bold dashed line 802 corresponds to a characteristic curve of the transistor 15b is explained.

When writing data current, the first switch 12 and the second switch 13 in FIG. 2(B) are turned OFF and the third switch 14 is turned ON. As the third switch 14 is turned ON, a gate and drain of the transistor 15a configuring the driving element are short-circuited. Therefore, an operation point of the transistor 15a is on the bold solid line 801, which is dependent on an input data current value $I_{in}$. Now it is assumed that the operation point is at the intersection point of the solid line 803 and the bold solid line 801.

On the other hand, the transistor 15b operates in non-saturation region when writing data current. A drain voltage $V_d$ of the transistor 15b is equivalent to what deducted a drain voltage $V_d$ of the transistor 15a from a gate voltage $V_g$ of the transistor 15b, therefore, lengths of two horizontal double-dashed arrows are equal when an operation point of the transistor 15b is dependent on the input data current value $I_{in}$ on the solid line 805.

When outputting current data, the first switch 12 and the second switch 13 in FIG. 2(B) are turned ON and the third switch 14 is turned OFF As the third switch 14 is turned OFF, gate potentials of the transistors 15a and 15b are stored as they are of the time of data current writing. As a result the gate voltage $V_g$ of the both transistors 15a and 15b becomes the sum of each drain voltage $V_d$ of the transistors 15a and 15b at the time of data current wiring. The transistors 15a and 15b operate in saturation region when outputting current. Therefore, the operation point of the transistor 15b is an intersection point of a chain double-dashed curve 806 and the bold dashed line 802, and the operation point of the transistor 15a is an intersection point of the other chain double-dashed curve 806 and the bold solid line 801. Furthermore, as the transistors 15a and 15b are connected in parallel, the output current $I_{out}$ is twice as large as the length of a chain double-dashed arrow with a triangle arrowhead in 807.

Similarly in FIG. 4(A), in the case where the bold dashed line 802 corresponds to both characteristic curves of the transistors 15a and 15b, the output current $I_{out}$ becomes twice as large as the length of a broken arrow with a triangle arrowhead in 807. In FIG. 4(A), in the case where the bold dashed line 802 corresponds to the characteristic curve of the transistor 15a and the bold solid line 801 corresponds to the characteristic curve of the transistor 15b, the output current $I_{out}$ becomes twice as large as the length of a dashed arrow with a triangle arrowhead in 807.

Abovementioned is a magnitude of the output current $I_{out}$ in the case of FIG. 4(A) as for the current data amplifier circuit in FIG. 2(B) of the embodiment of the invention. The output current $I_{out}$ has a variation to the extent which corresponds to the length of each arrow in 807.

As a comparison to this variation, variation of the output current $I_{out}$ in the current data amplifier circuit of FIG. 3 are shown in 808. Reference numeral 808 in FIG. 4(A) is an output current $I_{out}$ in the case where electrical characteristics of transistors 312 or 313 in current mirror configuration shown in FIG. 3 correspond to the bold solid line 801 or the bold dashed line 802 in FIG. 4(A).

When the length of each arrow in 807 and 808 in FIG. 4(A) are compared, it is found that variation is clearly smaller in 807. Therefore, the current data amplifier circuit in FIG. 2(B) of the embodiment of the invention has smaller variation in the output current $I_{out}$ than the one in FIG. 3.

Next, the case of FIG. 4(B) is explained. The same as FIG. 4(A) can be applied to FIG. 4(B). As for the current data amplifier circuit in FIG. 2(B) of the embodiment of the invention, in the case where the bold solid line 801 corresponds to the characteristic curves of the both transistors 15a and 15b, the output current $I_{out}$ becomes twice as large as the length of the solid arrow with a triangle arrowhead in 807. In the case where the bold solid line 801 corresponds to the characteristic curve of the transistor 15a and the bold dashed line 802 corresponds to the characteristic curve of the transistor 15b, the output current $I_{out}$ becomes twice as large as the length of the chain double-dashed arrow with a triangle arrowhead in 807. In the case where the bold dashed line 802 corresponds to the characteristic curves of both transistors 15a and 15b, the output current $I_{out}$ becomes twice as large as the broken arrow with a triangle arrowhead in 807. In the case where the bold dashed line 802 corresponds to the characteristic curve of the transistor 15a and the bold solid line 801 corresponds to the characteristic curve of the transistor 15b, the output current $I_{out}$ becomes twice as large as the length of a chain dashed arrow with a triangle arrowhead in 807.

Thus, in the case of FIG. 4(B), a magnitude of the output current $I_{out}$ of the current data amplifier circuit in FIG. 2(B) of the embodiment of the invention has a variation to the extent which corresponds to the length of each arrow in 807.

Variation of the output current $I_{out}$ in the current data amplifier circuit of FIG. 3 are shown with the length of each arrow in 808. Reference numeral 808 in FIG. 4(B) is an output current $I_{out}$ in the case where electrical characteristics of transistors 312 or 313 in current mirror configuration shown in FIG. 3 correspond to the bold solid line 801 or the bold dashed line 802 in FIG. 4(B).

When the length of each arrow in 807 and 808 are compared, again it is found that variation is clearly smaller in 807. Therefore, the current data amplifier circuit in FIG. 2(B) of the embodiment of the invention has smaller variation in the output current $I_{out}$ than the one in FIG. 3.

In the Embodiment Mode 3, the effect of the invention in the case where the number of transistors n configuring the driving element is two is explained as an example. The same can be applied to the case where the number of transistors n configuring the driving element is three or more. It should be noted that the larger the number of transistors n configuring the driving element becomes, the weaker the effect for reducing the influence of the variation of TFT characteristics tends to be. Of course, amplification ratio of the current can be increased according to n, therefore an optimum value of n varies depending on applications.

Furthermore, it is assumed in Embodiment Mode 3 that the transistor characteristic is ideal and parasitic resistance and ON resistance and the like of the transistor connected in series are ignored, however, in practice they have a slight influence. However, it is needless to say that the current data amplifier circuit of the invention is still efficient for suppressing the variation in output current.

Embodiment Mode 4

In Embodiment Mode 4, some examples of electronic devices using the current data amplifier circuit of the invention are shown.

Figure 5:
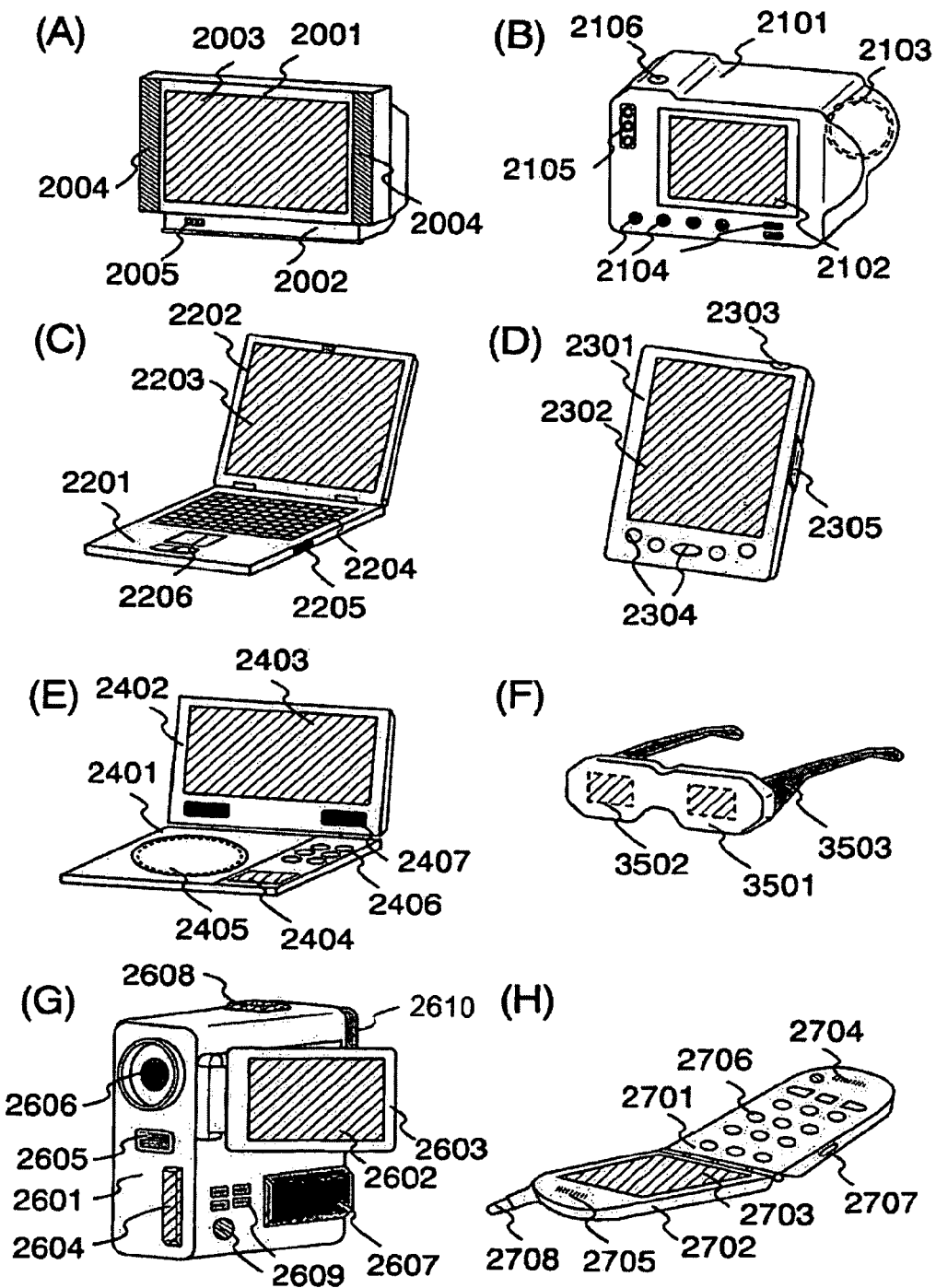
FIGS. 5A to 5H are examples of an electronic device using a current data amplifier circuit of the invention.

Given as examples of an electronic device that employs the current data amplifier circuit of the invention are a monitor, a video camera, a digital camera, a goggle type display (head mounted display), a navigation system, a sound reproducing system (audio component stereo, car audio system, or the like) a laptop computer, a game machine, a portable information terminal (a mobile computer, a mobile phone, a portable game machine, an electronic book, etc.), and an image reproducing device equipped with a recording medium (specifically, a device equipped with a display device which can reproduce a recording medium such as a digital versatile disk (DVD), and can display the image thereof). Specific examples of the electronic devices are shown in FIG. 5.

FIG. 5(A) is a monitor which, in this example, is composed of a frame 2001, a support base 2002, a display portion 2003, a speaker portion 2004, a video input terminal 2005, and the like. The current data amplifier circuit of the invention can be used in an IC (Integrated Circuit) for controlling the display portion 2003 and the speaker portion 2004, an IC for processing video signals, or a system circuit and the like. In the case where the current data amplifier circuit of the invention is fabricated by using polysilicon TFTs, it can also be fabricated directly on a substrate in the display portion 2003. Note that the term monitor includes all the display devices for displaying information, such as for personal computers, for receiving TV broadcasting, and for advertising.

FIG. 5B is a digital still camera which, in this example, is composed of a main body 2101, a display portion 2102, an image-receiving portion 2103, operation keys 2104, an external connection port 2105, a shutter 2106, and the like. The current data amplifier circuit of the invention can be used in an IC (Integrated Circuit) for controlling the display portion 2102 and the image-receiving portion 2103, an IC for processing video signals, or a system circuit and the like. In the case where the current data amplifier circuit of the invention is fabricated by using polysilicon TFTs, it can also be fabricated directly on a substrate in the display portion 2102.

FIG. 5(C) is a laptop computer which, in this example, is composed of a main body 2201, a frame 2202, a display portion 2203, a keyboard 2204, an external connection port 2205, a pointing mouse 2206, and the like. The current data amplifier circuit of the invention can be used in an IC (Integrated Circuit) for controlling the display portion 2203, an IC for processing video signals, or a system circuit and the like. In the case where the current data amplifier circuit of the invention is fabricated by using polysilicon TFTs, it can also be fabricated directly on a substrate in the display portion 2203.

FIG. 5(D) is a mobile computer which, in this example, is composed of a main body 2301, a display portion 2302, a switch 2303, operation keys 2304, an infrared port 2305, and the like. The current data amplifier circuit of the invention can be used in an IC (Integrated Circuit) for controlling the display portion 2302, an IC for processing video signals, or a system circuit and the like. In the case where the current data amplifier circuit of the invention is fabricated by using polysilicon TFTs, it can also be fabricated directly on a substrate in the display portion 2302.

FIG. 5(E) is a portable image reproduction device provided with a recording medium (specifically, a DVD reproduction device) which, in this example, is composed of a main body 2401, a frame 2402, a display portion A 2403, a display portion B 2404, a recording medium (such as a DVD) read-in portion 2405, operation keys 2406, a speaker portion 2407, and the like. The current data amplifier circuit of the invention can be used in an IC (Integrated Circuit) for controlling the display portion A 2403 and the display portion B 2404, an IC for processing video signals, or a system circuit and the like. In the case where the current data amplifier circuit of the invention is fabricated by using polysilicon TFTs, it can also be fabricated directly on a substrate in the display portions 2403 and 2404. Note that image reproduction devices provided with a recording medium include game machines for domestic use and the like.

FIG. 5(F) is a goggle type display (head mounted display) which, in this example, is composed of a main body 2501, a display portion 2502, an arm 2503, and the like. The current data amplifier circuit of the invention can be used in an IC (Integrated Circuit) for controlling the display portion 2502, an IC for processing video signals, or a system circuit and the like. In the case where the current data amplifier circuit of the invention is fabricated by using polysilicon TFTs, it can also be fabricated directly on a substrate in the display portion 2502.

FIG. 5(G) is a video camera which, in this example, is composed of a main body 2601, a display portion 2602, a frame 2603, an external connection port 2604, a remote control receiving portion 2605, an image receiving portion 2606, a battery 2607, an audio input portion 2608, operation keys 2609, an eyepiece portion 2610, and the like. The current data amplifier circuit of the invention can be used in an IC (Integrated Circuit) for controlling the display portion 2602, an IC for processing video signals, or a system circuit and the like. In the case where the current data amplifier circuit of the invention is fabricated by using polysilicon TFTs, it can also be fabricated directly on a substrate in the display portion 2602.

FIG. 5(H) is a mobile phone which, in this example, is composed of a main body 2701, a frame 2702, a display portion 2703, an audio input portion 2704, an audio output portion 2705, operation keys 2706, an external connection port 2707, an antenna 2708, and the like. The current data amplifier circuit of the invention can be used in an IC (Integrated Circuit) for controlling the display portion 2703, an IC for processing video signals, or a system circuit and the like. In the case where the current data amplifier circuit of the invention is fabricated by using polysilicon TFTs, it can also be fabricated directly on a substrate in the display portion 2703.

The applicable range of the invention is extremely wide, and it is possible to apply the invention to electronic devices and the like in all fields and not exclusively limited to above-described examples.

The invention claimed is:

1. An electronic device having an electronic circuit comprising:
    a driving element including a plurality of transistors;
    wherein the plurality of transistors are connected in series when inputting current as a first step and the plurality of transistors are connected in parallel when outputting current as a second step, and
    wherein the electronic circuit amplifies an inputted current for output.

2. The electronic device according to claim 1, wherein the plurality of transistors are either all p-channel type or n-channel type.

3. The electronic device according to claim 1, wherein channel lengths, channel widths and insulating film thicknesses of the plurality of transistors are all equal.

4. The electronic device according to claim 1, wherein the plurality of transistors are TFTs.

5. The electronic device according to claim 1, wherein the electronic circuit is included in an integrated circuit.

6. The electronic device according to claim 1, wherein the electronic circuit is included in a system circuit and is formed over a glass substrate.

7. The electronic device according to claim 1, wherein the electronic device is one selected from the group consisting of a monitor, a video camera, a digital camera, a goggle type display, a navigation system, an audio component system, a car audio, a personal computer, a game machine, a mobile computer, a portable phone, a portable game machine, an electronic hook, and an image reproduction device provided with a recording medium.

8. An electronic device having an electronic circuit comprising:
a driving element including a plurality of transistors;
wherein the electronic circuit has means to switch between a series connection state and a parallel connection state of the plurality of transistors;
wherein the plurality of transistors are connected in series when inputting current and in parallel when outputting current, and
wherein the electronic circuit amplifies an inputted current for output.

9. The electronic device according to claim 8, wherein the plurality of transistors are either all p-channel type or n-channel type.

10. The electronic device according to claim 8, wherein channel lengths, channel widths and insulating film thicknesses of the plurality of transistors are all equal.

11. The electronic device according to claim 8, wherein the plurality of transistors are TFTs.

12. The electronic device according to claim 8, wherein the electronic circuit is included in an integrated circuit.

13. The electronic device according to claim 8, wherein the electronic circuit is included in a system circuit and is formed over a glass substrate.

14. An electronic device having an electronic circuit which amplifies an inputted current when outputted, comprising:
a driving element including a plurality of transistors; and
a switch,
wherein each gate of the plurality of transistors is connected to each other;
wherein at least one of a source or a drain of each of the plurality of transistors is connected to a source or a drain of another transistor of the plurality of transistors;
wherein the switch switches the plurality of transistors between a series connection state and a parallel connection state, and
wherein the plurality of transistors are connected in series when inputting current and in parallel when outputting current.

15. The electronic device according to claim 14, wherein the plurality of transistors are either all p-channel type or n-channel type.

16. The electronic device according to claim 14, wherein channel lengths, channel widths and insulating film thicknesses of the plurality of transistors are all equal.

17. The electronic device according to claim 14, wherein the plurality of transistors are TFTs.

18. The electronic device according to claim 14, wherein the electronic circuit is included in an integrated circuit.

19. The electronic device according to claim 14, wherein the electronic circuit is included in a system circuit and is formed over a glass substrate.

20. An electronic device having an electronic circuit comprising:
n transistors, wherein n is a natural number; and
a first and a second switch,
wherein gates of the n transistors are connected electrically;
either of sources or drains of the n transistors are electrically connected to the first switch respectively;
another of sources or drains of the n transistors are electrically connected to the second switch respectively;
when a current is inputted to the electronic circuit, as for a $k^{th}$ transistor (k=2 to less than n) in the n transistors, a current flows through a $(k-1)^{th}$ transistor to a $(k+1)^{th}$ transistor via the $k^{th}$ transistor;
when the current is outputted in the electronic circuit, as for the $k^{th}$ transistors, the current flows from the side connected to the second switch to the side connected to the first switch.

21. The electronic device according to claim 20, wherein the plurality of transistors arc either all p-channel type or n-channel type.

22. The electronic device according to claim 20, wherein channel lengths, channel widths and insulating film thicknesses of the plurality of transistors are all equal.

23. The electronic device according to claim 20, wherein the plurality of transistors are TFTs.

24. The electronic device according to claim 20, wherein the electronic circuit is included in an integrated circuit.

25. The electronic device according to claim 20, wherein the electronic circuit is included in a system circuit and is formed over a glass substrate.

26. A personal computer comprising:
a body,
a housing,
an external connecting port,
and an electronic circuit having a driving element,
wherein the driving element comprises a plurality of transistors,
wherein the electronic circuit has means to switch between a series connection state and a parallel connection state of the plurality of transistors,
wherein the plurality of transistors are connected in series when inputting current and the plurality of transistors are connected in parallel when outputting current, and
wherein the electronic circuit amplifies an inputted current for output.

27. The personal computer according to claim 26, wherein the personal computer comprises a display portion.

28. The personal computer according to claim 26, wherein the electronic circuit is included in a display portion.

29. The personal computer according to claim 26, wherein the personal computer comprises a keyboard and a pointing mouse.

30. The personal computer according to claim 26, wherein the electronic circuit is included in an integrated circuit.

31. The personal computer according to claim 26, wherein the electronic circuit is included in a system circuit and is formed over a glass substrate.

32. A personal computer comprising:
a body,
a housing,
an external connecting port, and
an electronic circuit having a driving element,
wherein the electronic circuit comprises a driving element provided with a plurality of transistors and a switch,
wherein the electronic circuit amplifies an inputted current for output,
wherein gates of the plurality of transistors are connected to each other,
wherein at least one of a source or a drain of each of the plurality of transistors is connected to a source or a drain of another transistor of the plurality of transistors, wherein the switch switches the plurality of transistors between a senes connection state and a parallel connection state, and wherein the plurality of transistors are connected in series when inputting current and the plurality of transistors are connected in parallel when outputting current.

33. The personal computer according to claim 32, wherein the electronic circuit is included in an integrated circuit.

34. The personal computer according to claim 32, wherein the electronic circuit is included in a system circuit and is formed over a glass substrate.

35. The personal computer according to claim 32, wherein the personal computer comprises a display portion.

36. The personal computer according to claim 32, wherein the electronic circuit is included in a display portion.

37. The personal computer according to claim 32, wherein the personal computer comprises a keyboard and a pointing mouse.

* * * * *